United States Patent
Cline et al.

(10) Patent No.: US 10,935,586 B2
(45) Date of Patent: Mar. 2, 2021

(54) MEASURING DEVICE AND MEASURING METHOD WITH TIME CALCULATION

(71) Applicant: Rohde & Schwarz GmbH & Co. KG, Munich (DE)

(72) Inventors: Jeremy Cline, Flower Mound, TX (US); William Wangard, Kildeer, IL (US); Jeffrey Salamon, Exton, PA (US)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 85 days.

(21) Appl. No.: 16/359,582

(22) Filed: Mar. 20, 2019

(65) Prior Publication Data
US 2020/0300902 A1   Sep. 24, 2020

(51) Int. Cl.
*G01R 31/00* (2006.01)
*G01D 9/20* (2006.01)
*G01D 7/02* (2006.01)

(52) U.S. Cl.
CPC ............ *G01R 31/001* (2013.01); *G01D 7/02* (2013.01); *G01D 9/20* (2013.01)

(58) Field of Classification Search
CPC ........... H04N 5/23293; H04N 5/23229; H04N 5/23206; G01N 21/8483; G01N 2201/12; G06F 19/3418
USPC ................................ 324/144, 601, 403, 600
See application file for complete search history.

(56) References Cited

U.S. PATENT DOCUMENTS

| 4,843,445 A * | 6/1989 | Stemme | G01F 1/6845 257/470 |
| 6,604,209 B1 * | 8/2003 | Grucci | G06F 11/3688 714/38.1 |
| 8,211,559 B1 * | 7/2012 | Waggoner | H01M 10/482 429/90 |
| 10,720,965 B2 * | 7/2020 | Rowell | H04B 17/102 |
| 10,732,222 B2 * | 8/2020 | Peschke | G01R 31/31725 |
| 10,735,593 B1 * | 8/2020 | Dinsing | H04L 51/046 |

OTHER PUBLICATIONS

"Sweep Settings", retrieved on Mar. 11, 2019, from http://ena.support.keysight.com/e5080a/manuals/webhelp/eng/s1_settings/sweep.htm, 9 pages.

* cited by examiner

*Primary Examiner* — Giovanni Astacio-Oquendo
(74) *Attorney, Agent, or Firm* — Ditthavong & Steiner P.C.

(57) ABSTRACT

A measuring device is provided. The measuring device comprises a user input, a storage, and a processor. In this context, the user input is configured to receive at least one measurement sequence from a user, whereas the storage is configured to store at least one measurement parameter and at least one duration of time required by the measuring device to achieve the at least one measurement parameter. In addition to this, the processor is configured to calculate the total time needed for the at least one measurement sequence on the basis of the at least one duration of time.

21 Claims, 2 Drawing Sheets

MEASURING DEVICE AND MEASURING METHOD WITH TIME CALCULATION

TECHNICAL FIELD

The invention relates to a measuring device and a measuring method, wherein especially the total time needed for at least one measurement sequence is calculated.

BACKGROUND ART

Generally, in times of an increasing number of applications employing circuitry, there is a growing need of a measuring device and a measuring method for performing measurements with respect to a device under test comprising such an application in order to verify correct functioning of said applications in a highly efficient manner.

In this context of testing, end users must usually stay at their respective test station for an unknown amount of time, which disadvantageously leads to an inefficient use of labor resources. In addition to this, said end users do not know how much time is left once they start the respective scan, which can take anywhere from minutes to several hours because of, for instance, the corresponding applicable electromagnetic compatibility standards' requirements. Nevertheless, there is neither a measuring device nor a measuring method which could solve the foregoing problem of inefficiency.

Accordingly, there is a need to provide a measuring device with time calculation and a measuring method with time calculation, each of which especially ensures an increased efficiency.

SUMMARY OF THE INVENTION

According to a first aspect of the invention, a measuring device is provided. The measuring device comprises an user input, a storage, and a processor. In this context, the user input is configured to receive at least one measurement sequence from a user, whereas the storage is configured to store at least one measurement parameter and at least one duration of time required by the measuring device to achieve the at least one measurement parameter. In addition to this, the processor is configured to calculate the total time needed for the at least one measurement sequence on the basis of the at least one duration of time. Advantageously, in this manner, a high efficiency can be ensured.

According to a first preferred implementation form of the first aspect of the invention, the processor is further configured to display the total time on an user interface. Advantageously, a countdown timer may preferably be displayed, which especially tells the end user how much time is left until the measurement sequence is completed. Further advantageously, end users may exactly know when a defined measurement sequence will finish. Moreover, as a further advantage, the end users may especially know when it is sensible to leave a measurement station overnight, for example, or if they should check back in a certain amount of time, exemplarily an hour, to perform another measurement. Advantageously, as a result, the end users can especially work on other tasks, which improves overall labor efficiency.

According to a second preferred implementation form of the first aspect of the invention, the measuring device further comprises a display. In this context, the display is configured to display the total time. Advantageously, the measuring device itself can directly display the total time, which especially leads to an increased efficiency.

According to a further preferred implementation form of the first aspect of the invention, the at least one measurement parameter is required for the at least one measurement sequence, preferably for each of the at least one measurement sequence. Advantageously, for instance, complexity can be reduced, thereby increasing efficiency.

According to a further preferred implementation form of the first aspect of the invention, the user input comprises at least one of an interface, a user interface, a remote control, a file, a load file, a standard commands for programmable instruments load file, or any combination thereof. Advantageously, in this manner, efficiency can further be increased.

According to a further preferred implementation form of the first aspect of the invention, the at least one measurement parameter comprises at least one of dwell time, measurement time for individual frequency, dwell time with respect to measurements of at least one certain standard, measurement time for individual frequency with respect to measurements of at least one certain standard, frequency resolution, or any combination thereof. Advantageously, for example, measurement labor efficiency can further be increased.

According to a further preferred implementation form of the first aspect of the invention, the at least one measurement parameter comprises standards setting dwell times on certain frequencies and time required for a sweep of the respective remaining frequencies. Advantageously, for instance, inefficiency can further be reduced.

According to a further preferred implementation form of the first aspect of the invention, the at least one measurement parameter comprises at least one of frequency span, detector settings, resolution, number of points in final measurement, mode of operation, or any combination thereof. Advantageously, said detector settings may preferably comprise raw data, maximum peak data, other data points, or any combination thereof. Further advantageously, the number of points in final measurement may especially be a number of peaks to be rescanned. Moreover, as a further advantage, the mode of operation may especially comprise at least one of a spectrum analyzer mode, a receiver mode, an electromagnetic interference receiver mode, a time domain scan mode, or any combination thereof.

According to a further preferred implementation form of the first aspect of the invention, the processor is further configured to take into account switching time and/or setup time of further measurement equipment for the calculation of the total time. Advantageously, the total time can be calculated in a highly accurate manner.

According to a further preferred implementation form of the first aspect of the invention, the total time is displayed as a countdown. Advantageously, end users may exactly know when a defined measurement sequence will finish.

According to a further preferred implementation form of the first aspect of the invention, the total time is updated as particular tasks in the at least one measurement sequence are completed. Advantageously, the total time or the countdown, respectively, can be calculated in a highly accurate manner.

According to a further preferred implementation form of the first aspect of the invention, the measuring device comprises or is a receiver, preferably an electromagnetic interference receiver. Advantageously, efficiency with special respect to electromagnetic compatibility measurements can be increased.

According to a second aspect of the invention, a measuring method is provided. The measuring method comprises the steps of receiving at least one measurement sequence from a user with the aid of an user input of a measuring device, storing at least one measurement parameter and at least one duration of time required by the measuring device to achieve the at least one measurement parameter with the aid of a storage, and calculating the total time needed for the at least one measurement sequence on the basis of the at least one duration of time with the aid of a processor. Advantageously, in this manner, a high efficiency can be ensured.

According to a first preferred implementation form of the second aspect of the invention, the measuring method further comprises the step of displaying the total time on an user interface with the aid of the processor. In addition to this or as an alternative, the measuring method further comprises the step of displaying the total time with the aid of a display. Advantageously, a countdown timer may preferably be displayed, which especially tells the end user how much time is left until the measurement sequence is completed. Further advantageously, end users may exactly know when a defined measurement sequence will finish. Moreover, as a further advantage, the end users may especially know when it is sensible to leave a measurement station overnight, for example, or if they should check back in a certain amount of time, exemplarily an hour, to perform another measurement. Advantageously, as a result, the end users can especially work on other tasks, which improves overall labor efficiency.

According to a second preferred implementation form of the second aspect of the invention, the at least one measurement parameter is required for the at least one measurement sequence, preferably for each of several measurement sequences. Advantageously, for instance, complexity can be reduced, thereby increasing efficiency.

According to a further preferred implementation form of the second aspect of the invention, the user input comprises at least one of an interface, an user interface, a remote control, a file, a load file, a standard commands for programmable instruments load file, or any combination thereof. Advantageously, in this manner, efficiency can further be increased.

According to a further preferred implementation form of the second aspect of the invention, the at least one measurement parameter comprises at least one of dwell time, measurement time for individual frequency, dwell time with respect to measurements of at least one certain standard, measurement time for individual frequency with respect to measurements of at least one certain standard, frequency resolution, or any combination thereof. In addition to this or as an alternative, the at least one measurement parameter comprises standards setting dwell times on certain frequencies and time required for a sweep of the respective remaining frequencies. Further additionally or further alternatively, the at least one measurement parameter comprises at least one of frequency span, detector settings, resolution, number of points in final measurement, mode of operation, or any combination thereof. Advantageously, for example, measurement labor efficiency can further increased. Further advantageously, said detector settings may preferably comprise raw data, maximum peak data, other data points, or any combination thereof. As a further advantage, the number of points in final measurement may especially be a number of peaks to be rescanned. Moreover, further advantageously, the mode of operation may especially comprise at least one of a spectrum analyzer mode, a receiver mode, an electromagnetic interference receiver mode, a time domain scan mode, or any combination thereof.

According to a further preferred implementation form of the second aspect of the invention, the measuring method further comprises the step of taking into account switching time and/or setup time of further measurement equipment for the calculation of the total time with the aid of the processor. Advantageously, the total time can be calculated in a highly accurate manner.

According to a further preferred implementation form of the second aspect of the invention, the measuring method further comprises the step of displaying the total time as a countdown. Advantageously, end users may exactly know when a defined measurement sequence will finish.

According to a further preferred implementation form of the second aspect of the invention, the measuring method further comprises the step of updating the total time as particular tasks in the at least one measurement sequence are completed. Advantageously, the total time or the countdown, respectively, can be calculated in a highly accurate manner.

BRIEF DESCRIPTION OF THE DRAWINGS

Exemplary embodiments of the invention are now further explained with respect to the drawings by way of example only, and not for limitation. In the drawings.

DETAILED DESCRIPTION OF THE PREFERRED EMBODIMENTS

Figure 1:
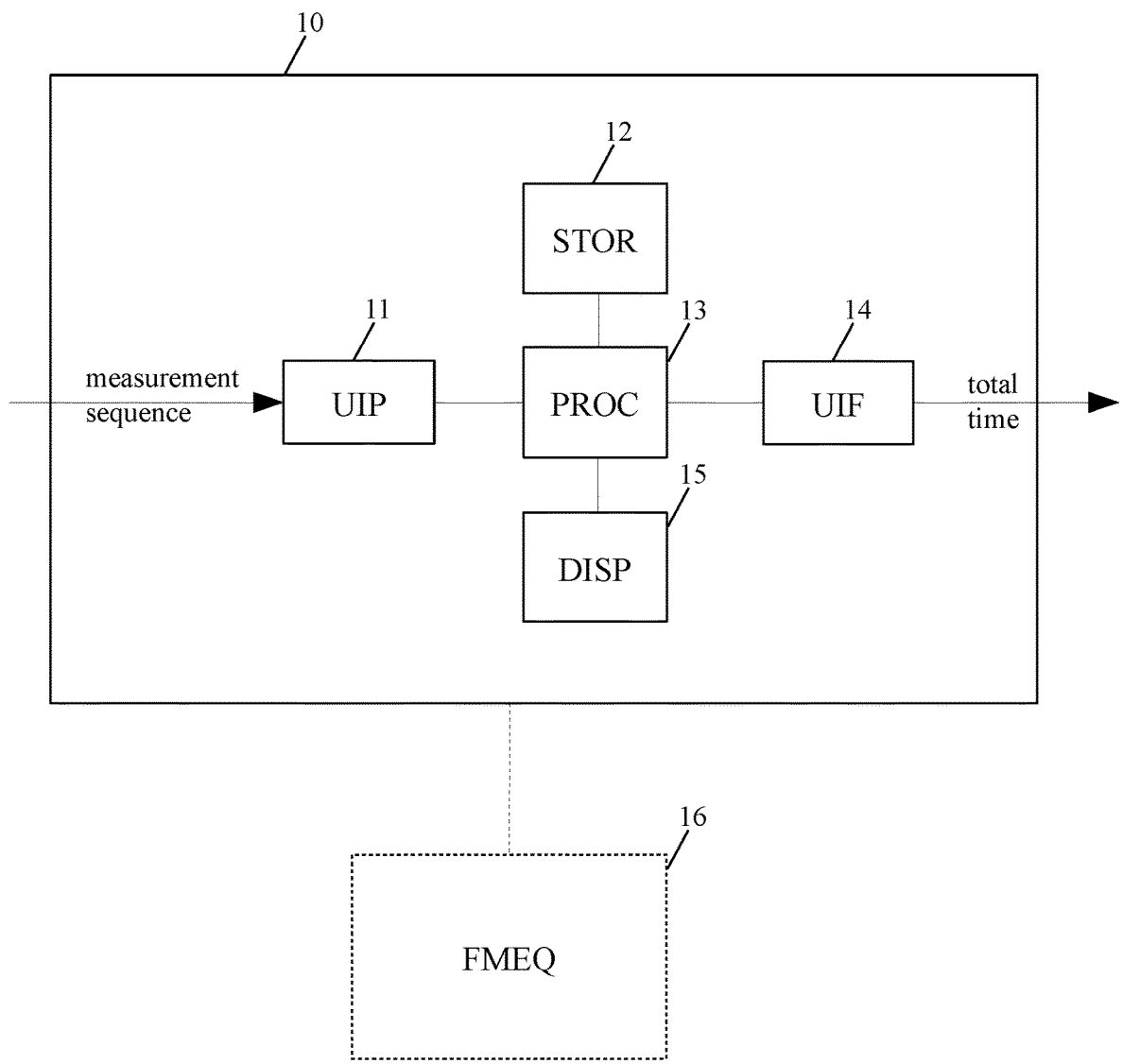
FIG. 1 shows an exemplary embodiment of the first aspect of the invention.

Firstly, FIG. 1 illustrates an exemplary embodiment of the inventive measuring device 10. Said measuring device 10 comprises an user input 11, a storage 12, and a processor 13. In this context, the user input 11 receives at least one measurement sequence from a user. Furthermore, the storage 12 stores at least one measurement parameter and at least one duration of time required by the measuring device to achieve the at least one measurement parameter. In addition to this, the processor 13 calculates the total time needed for the at least one measurement sequence on the basis of the at least one duration of time.

Additionally, the processor 13 further displays the total time on an user interface 14.

Moreover, the measuring device exemplarily comprises a display 15. Said display 15 displays the total time.

It is further noted that the at least one measurement parameter may especially be required for the at least one measurement sequence, preferably for each of the at least one measurement sequence.

It might be particularly advantageous if the user input comprises at least one of an interface, an user interface, a remote control, a file, a load file, a standard commands for programmable instruments load file, or any combination thereof.

Furthermore, the at least one measurement parameter may especially comprise at least one of dwell time, measurement time for individual frequency, dwell time with respect to measurements of at least one certain standard, measurement time for individual frequency with respect to measurements of at least one certain standard, frequency resolution, or any combination thereof.

In addition to this or as an alternative, the at least one measurement parameter may preferably comprise standards setting dwell times on certain frequencies and time required for a sweep of the respective remaining frequencies.

Further additionally or further alternatively, the at least one measurement parameter may especially comprise at least one of frequency span, detector settings, resolution, number of points in final measurement, mode of operation, or any combination thereof.

It is further noted that it might be particularly advantageous if the processor 13 takes into account switching time and/or setup time of further measurement equipment 16 for the calculation of the total time.

With respect to the total time, it should be mentioned that the total time may preferably be displayed as a countdown.

In addition to this, it is noted that the total time may especially be updated when particular tasks in the at least one measurement sequence are completed.

With respect to the measuring device 10, it is noted that the measuring device 10 may especially comprise or be a receiver, preferably an electromagnetic interference receiver.

As an alternative thereto, the measuring device 10 may especially comprise or be a spectrum analyzer, a time domain scanner, or a combination thereof.

In the following, a test setup is illustrated by way of example, wherein the hypothetical test situation defines the measurement sequence initiated by a user.

In this context, a frequency span describing the starting and stopping frequency is selected in which the user performs a pre-measurement to find critical points, for instance the frequencies where amplitude exceeds a predetermined limit. In addition to the pre-measured critical points, the user further provides critical points which are not already identified. At this point, the user performs a final measurement on all critical points with defined detector settings including, for example, the required dwell time for each identified critical point, settle time for the detector to create a value and so on.

To calculate the total measurement time for a particular mode of operation, for instance spectrum analyzer mode, measurement parameters are determined and these parameters are stored in the storage 12. In this context, the processor 13 calculates the total measurement time, for example in the spectrum analyzer mode by utilizing the selective measurement parameters namely the frequency span, resolution, total number of critical points, detector settings for the final measurement and the processing time required for the final measurement.

Figure 2:
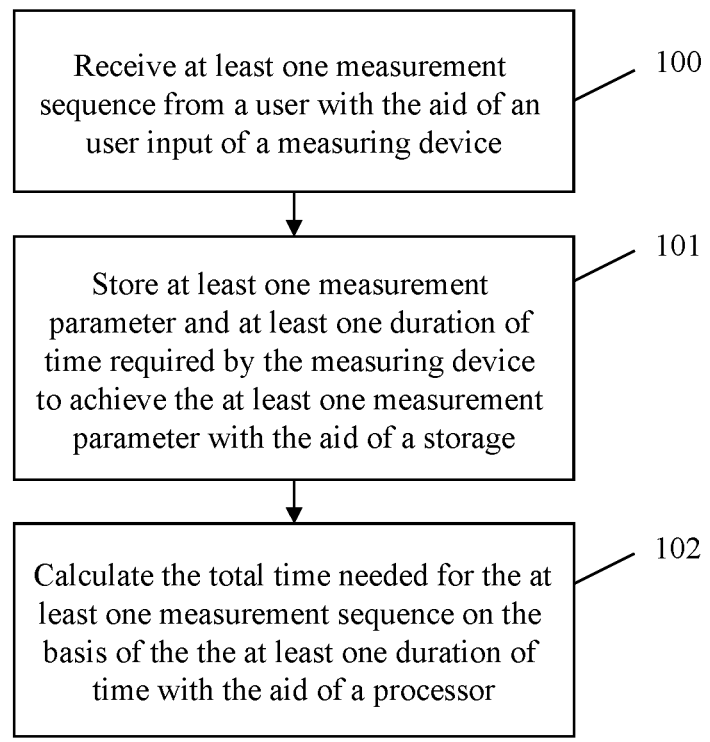
FIG. 2 shows a flow chart of an exemplary embodiment of the second aspect of the invention.

Finally, FIG. 2 shows a flow chart of an exemplary embodiment of the inventive measuring method. In a first step 100, at least one measurement sequence is received from a user with the aid of an user input of a measuring device. Then, in a second step 101, at least one measurement parameter and at least one duration of time required by the measuring device to achieve the at least one measurement parameter are stored with the aid of a storage. Furthermore, in a third step 102, the total time needed for the at least one measurement sequence is calculated on the basis of the at least one duration of time with the aid of a processor.

It might be particularly advantageous if the measuring method further comprises the step of displaying the total time on an user interface with the aid of the processor. In addition to this or as an alternative, the measuring method may further comprise the step of displaying the total time with the aid of a display.

It is further noted that the at least one measurement parameter may be required for the at least one measurement sequence, preferably for each of the at least one measurement sequence.

Moreover, the user input may especially comprise at least one of an interface, an user interface, a remote control, a file, a load file, a standard commands for programmable instruments load file, or any combination thereof.

Furthermore, the at least one measurement parameter may preferably comprise at least one of dwell time, measurement time for individual frequency, dwell time with respect to measurements of at least one certain standard, measurement time for individual frequency with respect to measurements of at least one certain standard, frequency resolution, or any combination thereof.

In addition to this or as an alternative, the at least one measurement parameter may especially comprise standards setting dwell times on certain frequencies and time required for a sweep of the respective remaining frequencies.

Further additionally or further alternatively, the at least one measurement parameter may preferably comprise at least one of frequency span, detector settings, resolution, number of points in final measurement, mode of operation, or any combination thereof.

It might be particularly advantageous if the measuring method further comprises the step of taking into account switching time and/or setup time of further measurement equipment for the calculation of the total time with the aid of the processor.

Additionally or alternatively, the measuring method may further comprise the step of displaying the total time as a countdown.

Furthermore, the measuring method may especially comprise the step of updating the total time as particular tasks in the at least one measurement sequence are completed.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A measuring device comprising:
   a user input,
   a storage, and
   a processor,
   wherein the user input is configured to receive at least one measurement sequence from a user,
   wherein the storage is configured to store at least one measurement parameter and at least one duration of time required by the measuring device to achieve the at least one measurement parameter,
   wherein the processor is configured to calculate total time needed for the at least one measurement sequence on the basis of the at least one duration of time; and wherein the processor is configured to display an aggregate time of at least two elements of the measurement sequence on a user interface.

2. The measuring device according to claim 1, further comprising a display, wherein the display is configured to display the total time.

3. The measuring device according to claim 1, wherein the at least one measurement parameter is required for a plurality of several measurement sequences.

4. The measuring device according to claim 1, wherein the user input comprises at least one of an interface, a user interface, a remote control, a file, a load file, a standard command for programmable instruments load file, or any combination thereof.

5. The measuring device according to claim 1, wherein the at least one measurement parameter comprises at least one of dwell time, measurement time for individual frequency, dwell time with respect to measurements of at least one certain standard, measurement time for individual frequency with respect to measurements of at least one certain standard, frequency resolution, or any combination thereof.

6. The measuring device according to claim 1, wherein the at least one measurement parameter comprises standards setting dwell times on certain frequencies and time required for a sweep of respective remaining frequencies.

7. The measuring device according to claim 1, wherein the at least one measurement parameter comprises at least one of frequency span, detector setting, resolution, number of points in final measurement, mode of operation, or any combination thereof.

8. The measuring device according to claim 1, wherein the processor is further configured to take into account switching time or setup time of further measurement equipment for the calculation of the total time.

9. The measuring device according to claim 1, wherein the total time is displayed as a countdown.

10. The measuring device according to claim 1, wherein the total time is updated as particular tasks in the at least one measurement sequence are completed.

11. The measuring device according to claim 1, further comprising an electromagnetic interference receiver.

12. The measuring device according to claim 1, wherein the processor is configured to display the total time of an entire sequence of the measurement sequence on a user interface.

13. A measuring method comprising the steps of:
receiving at least one measurement sequence from a user with the aid of a user input of a measuring device, storing at least one measurement parameter and at least one duration of time required by the measuring device to achieve the at least one measurement parameter with the aid of a storage,
calculating total time needed for the at least one measurement sequence on the basis of the at least one duration of time with the aid of a processor, and
displaying an aggregate time of at least two elements of the measurement sequence on a user interface.

14. The measuring method according to claim 13, wherein the user interface comprises a display.

15. The measuring method according to claim 14, further comprising the step of displaying the total time as a countdown.

16. The measuring method according to claim 13, wherein the at least one measurement parameter is required for a plurality of measurement sequences.

17. The measuring method according to claim 13, wherein the user input comprises at least one of an interface, a user interface, a remote control, a file, a load file, a standard commands for programmable instruments load file, or any combination thereof.

18. The measuring method according to claim 13, wherein the at least one measurement parameter comprises at least one of dwell time, measurement time for individual frequency, dwell time with respect to measurements of at least one certain standard, measurement time for individual frequency with respect to measurements of at least one certain standard, frequency resolution, or any combination thereof, or
wherein the at least one measurement parameter comprises standards setting dwell times on certain frequencies and time required for a sweep of respective remaining frequencies, or
wherein the at least one measurement parameter comprises at least one of frequency span, detector setting, resolution, number of points in final measurement, mode of operation, or any combination thereof.

19. The measuring method according to claim 13, further comprising the step of taking into account switching time or setup time of further measurement equipment for the calculation of the total time with the aid of the processor.

20. The measuring method according to claim 13, further comprising the step of updating the total time as particular tasks in the at least one measurement sequence are completed.

21. The measuring method according to claim 13, further comprising:
displaying the total time of an entire sequence of the measurement sequence on a user interface.

* * * * *